United States Patent
Leavy et al.

(10) Patent No.: US 7,148,140 B2
(45) Date of Patent: Dec. 12, 2006

(54) PARTIAL PLATE ANNEAL PLATE PROCESS FOR DEPOSITION OF CONDUCTIVE FILL MATERIAL

(75) Inventors: Montray Leavy, McKinney, TX (US); Stephan Grunow, Dallas, TX (US); Satyavolu S. Papa Rao, Garland, TX (US); Noel M. Russell, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 179 days.

(21) Appl. No.: 10/901,857

(22) Filed: Jul. 28, 2004

(65) Prior Publication Data

US 2006/0024962 A1    Feb. 2, 2006

(51) Int. Cl.
*H10L 21/44* (2006.01)
(52) U.S. Cl. .................. 438/666; 438/638; 438/687
(58) Field of Classification Search ................ 438/618, 438/622, 626, 631, 637, 638, 666, 687
See application file for complete search history.

(56) References Cited

U.S. PATENT DOCUMENTS

| 6,015,749 | A | 1/2000 | Liu et al. |
|---|---|---|---|
| 6,391,777 | B1 | 5/2002 | Chen et al. |
| 6,429,523 | B1 | 8/2002 | Andricacos et al. |
| 6,433,402 | B1 * | 8/2002 | Woo et al. .................. 257/525 |
| 6,489,240 | B1 | 12/2002 | Iacoponi et al. |
| 6,506,668 | B1 * | 1/2003 | Woo et al. .................. 438/648 |
| 6,548,395 | B1 * | 4/2003 | Woo et al. .................. 438/622 |
| 6,656,836 | B1 | 12/2003 | Wang et al. |
| 6,979,625 | B1 * | 12/2005 | Woo et al. .................. 438/687 |
| 2005/0227479 | A1 * | 10/2005 | Feng et al. .................. 438/637 |

OTHER PUBLICATIONS

"Mechanisms of Stress-Induced Voids in Multi-Level Cu Interconnects", Byung-Lyul Park, Sang-Rok Hah, Chan-Geun Park, Dong-Kwon Jeong,Hong-Seong Son, Hyeok-Sang Oh, Ju-Hyuk Chung, Jeong-Lim Nam,Kwang-Myeon Park and Jae-Dong Byun, IITC Conference, 2002, 3 pgs.

* cited by examiner

*Primary Examiner*—Kevin M. Picardat
(74) *Attorney, Agent, or Firm*—Peter K. McLarty; W. James Brady, III; Frederick J. Telecky, Jr.

(57) ABSTRACT

A method of fabricating a semiconductor device is provided. An interlayer dielectric layer is formed on one or more semiconductor layers (402). One or more feature regions are formed in the interlayer dielectric layer (404). A first conductive layer is formed in at least a portion of the feature regions and on the interlayer dielectric layer (406)). A first anneal is performed that promotes grain growth of the first conductive layer (408). An additional conductive layer is formed on the first conductive layer (410) and an additional anneal is performed (412) that promotes grain growth of the additional conductive layer and further promotes grain size growth of the first conductive layer. Additional conductive layers can be formed and annealed until a sufficient overburden amount has been obtained. Subsequently, a planarization process is performed that removes excess conductive material and thereby forms and isolates conductive features in the semiconductor device (414).

17 Claims, 9 Drawing Sheets

PARTIAL PLATE ANNEAL PLATE PROCESS FOR DEPOSITION OF CONDUCTIVE FILL MATERIAL

FIELD OF INVENTION

The present invention relates generally to semiconductor devices and more particularly damascene methods that employ a partial plate anneal plate process for deposition of conductive fill material.

BACKGROUND OF THE INVENTION

In the manufacture of semiconductor products such as integrated circuits, individual electrical devices are formed on or in a semiconductor substrate, and are thereafter interconnected to form electrical circuits. Interconnection of these devices within an integrated circuit, also referred to as metallization, is typically accomplished by forming a multi-level interconnect network structure in layers formed over the electrical devices, by which the device active elements are connected to other devices to create the desired circuits. Conductive materials such as aluminum, aluminum-silicon alloys, copper, and the like, are employed to provide relatively low resistance connections between components and devices.

In one example of metallization, individual wiring layers within a multi-level network can be formed by depositing an insulating or dielectric layer over the discrete devices or over a previous interconnect layer, and patterning and etching contact openings such as vias. Conductive material, such as tungsten is then deposited into the vias to form inter-layer contacts. A conductive layer may then be formed over the dielectric layer and patterned to form wiring interconnections between the device vias, thereby creating a first level of basic circuitry. Dielectric material is then deposited over the patterned conductive layer, and the process may be repeated any number of times using additional wiring levels laid out over additional dielectric layers with conductive vias therebetween to form the multi-level interconnect network. This type of metallization is adequate for some conductive materials, such as aluminum. However, other conductive materials are not well suited to being patterned and thus, are not typically employed in the above metallization process.

Copper is a particularly desirable material for metallization because of its low resistivity (about 1.7 micro ohm-cm) and superior resistance to electromigration compared with aluminum and/or aluminum alloys. However, etching and patterning of copper is problematic. Copper patterning difficulties have been avoided or mitigated through the use of single and dual damascene interconnect processes in which cavities are formed (etched) in a dielectric layer. Damascene processing involves the creation of interconnect lines by first etching a trench or canal in a planar dielectric layer and then filling that trench with metal, such as aluminum or copper. In dual damascene processing, a second level is involved where a series of holes (contacts or vias) are etched and filled in addition to the trench. Thus, copper is deposited into the trenches and/or vias and over the insulative layer, followed by planarization using, e.g., a chemical mechanical polishing (CMP) process to leave a copper wiring pattern including the desired interconnect metal lines inlaid within the dielectric layer trenches and vias. In the single damascene process copper trench patterns or vias are created which connect to existing interconnect structures thereunder, whereas in a dual damascene process, both vias and the trenches are filled at the same time using a single copper deposition and a single CMP planarization. The advantage of damascene processing is that it eliminates the need for metal etch, which is advantageous for copper interconnects.

Conventional single and dual damascene interconnect processing typically includes the formation of via cavities through a dielectric layer, in which the via etch process stops on an etch-stop layer underlying the dielectric. In the single damascene case, an etch-stop layer etch process is then performed to expose the underlying structure, such as a conductive feature (e.g., silicide contact or copper feature) in a pre-existing interconnect layer. The via cavity is then filled with copper, an anneal is performed, and the wafer is planarized, after which further interconnect levels may then be fabricated. In the dual damascene case, a trench cavity is etched and an etch-stop layer etch is performed to expose the underlying structure. The via and trench cavities are simultaneously filled with copper, annealed, and the wafer is planarized thereby forming the copper interconnects and contacts.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by improving grain growth in damascene processes while mitigating formation of undesirable voiding regions within conductive features such as vias, lines, and interconnects. Grain growth is improved by forming and annealing conductive layers multiple times instead of forming a single conductive layer followed by a single anneal as in conventional processes. The multiple conductive layers permit tailored temperatures for anneal processes that promote greater grain growth and, therefore, reduced resistance of formed conductive features.

In one aspect of the present invention, a method of fabricating a semiconductor device is provided. An interlayer dielectric layer is formed on one or more semiconductor layers. Via and trench regions are formed in the interlayer dielectric layer. A first conductive layer is formed in at least a portion of the via and trench region and on the interlayer dielectric layer, wherein the first conductive layer does not result in an overburden in the via/trench. A first anneal is performed that promotes grain growth of the first conductive layer. The first anneal can be performed at a higher temperature allowing greater grain growth because the first conductive layer is formed with a minimal amount of overburden. An additional, second conductive layer is formed on the first conductive layer and an additional anneal is performed that promotes grain growth of the additional conductive layer and further promotes grain growth of the first conductive layer. Additional conductive layers can be formed and annealed until a sufficient overburden amount has been obtained. Subsequently, a planarization process is performed that removes excess conductive material and thereby forms and isolates conductive features in the semiconductor device.

The following description and annexed drawings set forth in detail certain illustrative aspects and implementations of the invention. These are indicative of but a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while reducing masks employed in fabrication thereof.

The inventors of the present invention appreciate that interconnection of devices, such as transistor devices, within an integrated circuit, also referred to as metallization, is typically accomplished by forming a multi-level interconnect network structure in layers formed over the electrical devices, by which the device active elements are connected to other devices to create the desired circuits. Conductive materials, such as, aluminum, aluminum-silicon alloys, copper, copper alloys, and the like, are employed to provide relatively low resistance connections between components and devices.

Some conductive materials, such as copper, are not easily etched or patterned. For this reason and others, metallization layers are often formed by depositing a dielectric layer and etching trench and/or via regions into which conductive material is deposited. Subsequently, a planarization process, such as chemical mechanical planarization (CMP), is performed which removes excess conductive material and leaves the conductive material within the trench and/or via regions to serve as lines, interconnects, and the like. The planarization process generally requires that the conductive material be deposited to an overburden amount or overburden fill so that sufficient conductive material remains within the trench and/or via regions after planarization.

One problem with the deposited conductive material is that it is often of a small grain size, which if not increased could result in degraded reliability and performance. A mechanism to improve the grain size, and therefore to decrease resistance, is to perform an anneal which promotes growth of grain size in conductive materials. However, the temperatures of the anneal coupled with the overburdened fill of conductive material tend to create substantial stress in the conductive material within the trench and/or via regions. This stress can result in creation of void regions that can undesirably increase resistance and/or create undesired open circuit conditions.

In order to facilitate grain growth and mitigate formation of undesirable void regions, the inventors of the present invention employ a method that forms and anneals multiple layers of conductive materials prior to planarization instead of a single conductive layer and single anneal. As a result, greater grain growth and, therefore, lower resistance, can be obtained while mitigating formation of void regions.

Figure 1A:
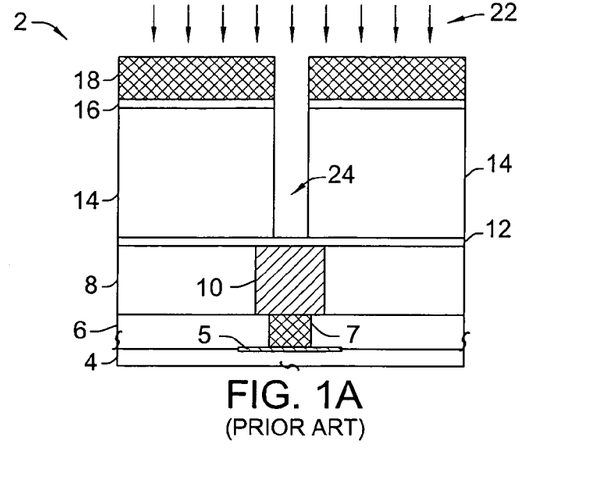
FIGS. 1A–1H illustrate problems that can occur with conventional damascene processes employing a single conductive layer and a single anneal of the conductive layer as appreciated by the inventors of the present invention.
Figure 1B:
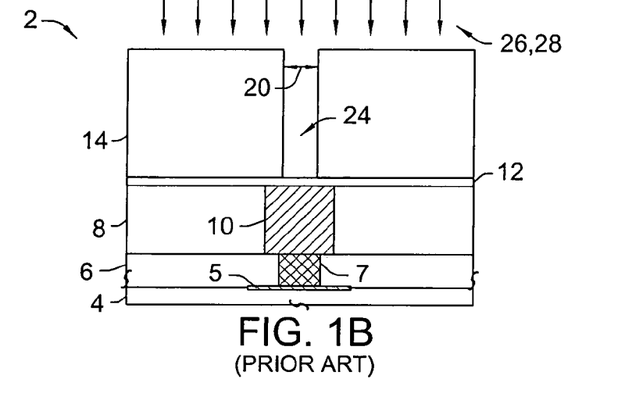

FIGS. 1A–1F, described below, illustrate problems that can occur with conventional damascene processes employing a single conductive layer (copper) and a single anneal of the conductive layer as appreciated by the inventors of the present invention. FIG. 1A illustrates a wafer 2 comprising a substrate 4, in which a conductive silicide structure 5 is formed. An initial contact layer is formed over the substrate 4, including a dielectric 6 and a conductive contact 7. A first interconnect structure is formed over the contact layer, including an etch-stop layer (not shown), and a dielectric 8 in which a conductive feature 10 is formed to provide electric coupling to the contact 7. An etch-stop layer 12 is formed over the dielectric 8 and over the contact 10, and a dielectric layer 14 is formed over the etch-stop layer 12. A BARC layer 16 is then typically formed over the dielectric 14 and a resist mask 18 is formed over the BARC layer 16. A via etch process 22 is performed in FIG. 1A to form a via cavity 24 in the layers 16 and 14, stopping on the etch-stop layer 12. In FIG. 1B, a resist ashing process 26 and a wet clean 28 are performed to remove the mask 18 and the BARC 16, resulting in a via cavity critical dimension 20.

Figure 1C:
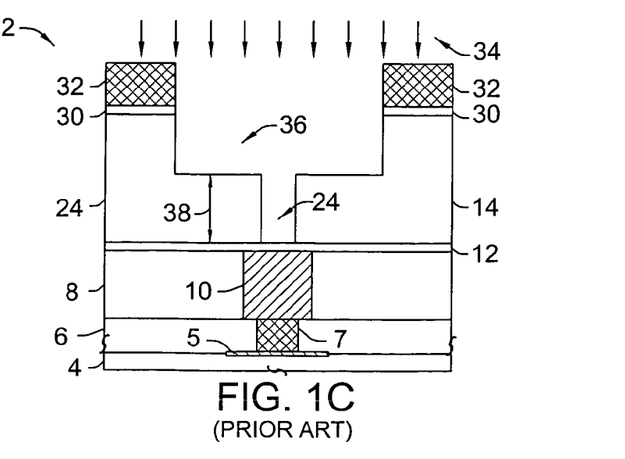
Figure 1D:
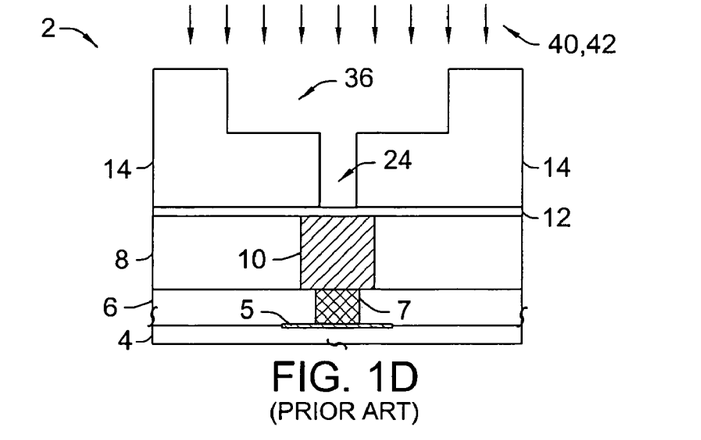
Figure 1E:
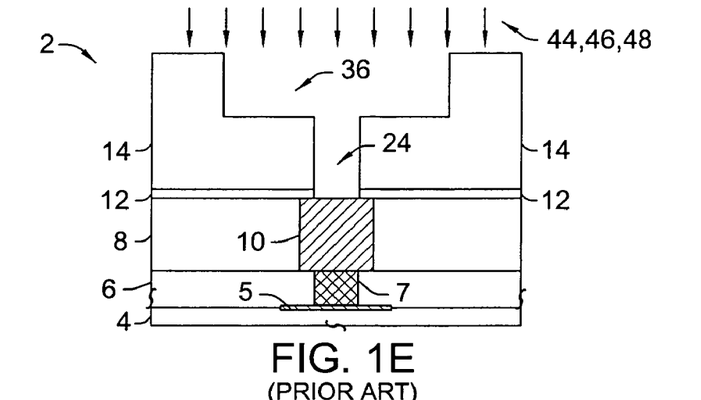

In FIG. 1C, a second BARC layer 30 and a trench resist mask 32 are formed over the wafer 2, and a trench etch operation 34 is performed to form a trench cavity or opening 36, leaving a trench bottom surface a thickness 38 above the previous interconnect dielectric material 8. Another ashing operation 40 and wet clean 42 are performed in FIG. 1D, and an etch-stop etch process 44 is then performed in FIG. 1E to etch the exposed etch-stop layer material 12 at the bottom of the via cavity 24. Thereafter in FIG. 1E, another ashing operation 46 and a wet clean 48 are performed.

Figure 1F:
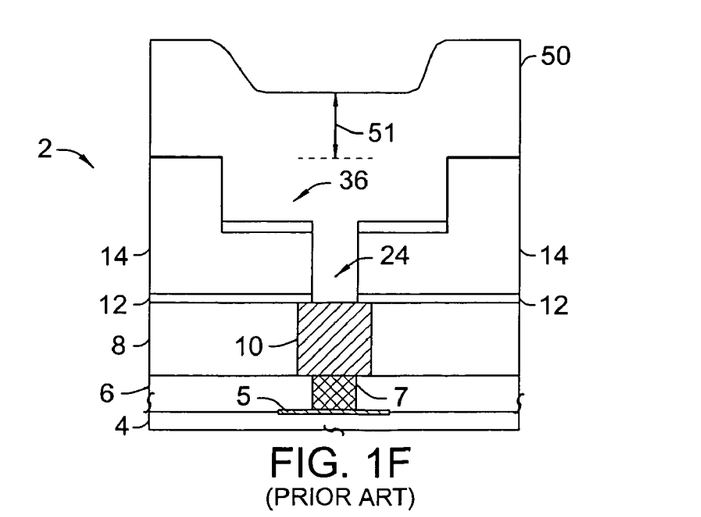

Typically, a diffusion barrier layer (not shown) is formed on surfaces and inside walls of the dielectric layer 14, and a seed layer (not shown) is typically formed on the barrier layer. The diffusion barrier layer mitigates diffusion of copper into the dielectric layer 14 and other underlying layers. Then, a copper layer 50 is deposited on the device, facilitated by the seed layer, with an amount of overburden 51 so as to fill the trench and vias as shown in FIG. 1F. Consequently, the overburden 51 is an amount of excess copper (or other metal) that is deposited to ensure adequate filling of the via and trench after planarization. Note that since the size of all vias and trenches are not the same on a given metallization layer, sufficient copper deposition is employed to ensure that the biggest metallization features are adequately filled. Consequently, the substantially smaller via/trench features will exhibit a substantial amount of overburden 51.

Figure 1G:
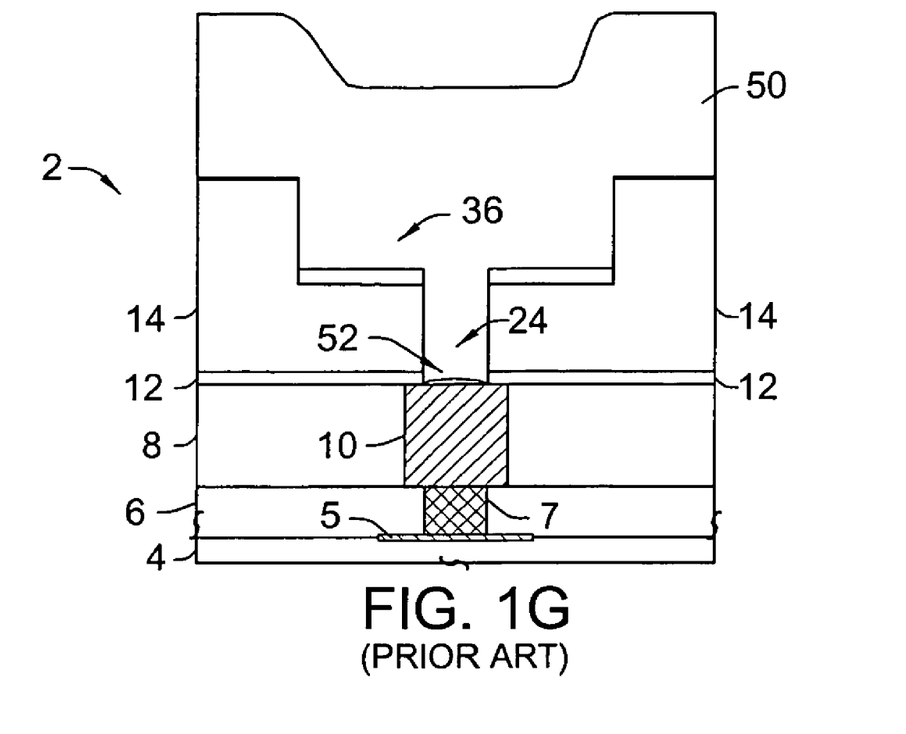
Figure 1H:
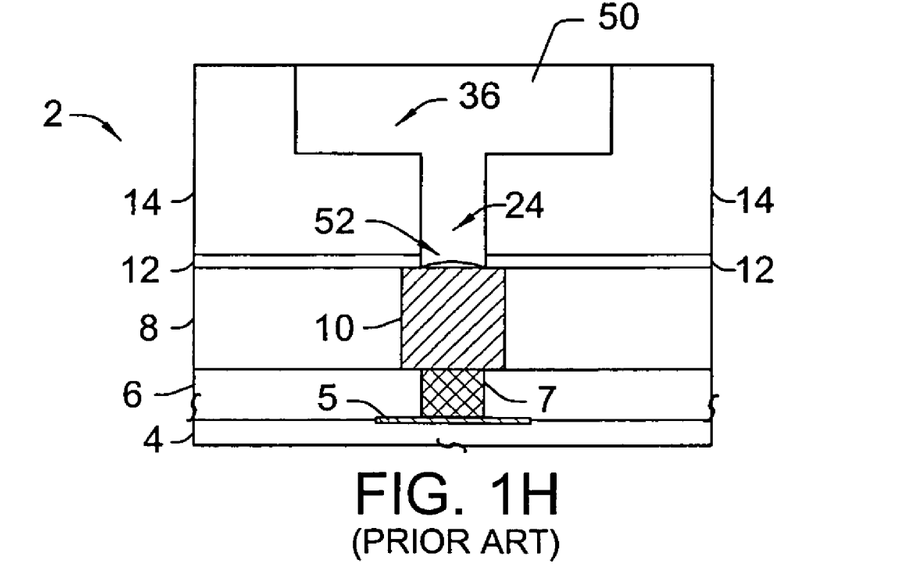

An anneal is then performed that increases the grain size of the copper layer 50. However, the expansion and contraction of the copper layer 50 during the anneal and subsequent cooling induces mechanical stress at lower regions of the copper layer in the via cavity 24. The stress can cause void regions 52 to occur that prevent proper electrically operation of the device 2, as shown in FIG. 1G. Generally, the greater the amount of overburden fill of copper, the greater induced stress in the via cavity. Additionally, the higher the temperature and/or length of the anneal, the greater the stress induced in the via cavity. As a result, the greater the amount of overburden and/or the temperature/length of the anneal, the greater the detrimental impacts of stress-induced voiding become. Subsequently, a chemical mechanical planarization is performed to remove portions of the copper layer 50 above the trench opening 36 and the via cavity 24. FIG. 1H illustrates the device 2 after planarization.

Figure 2A:
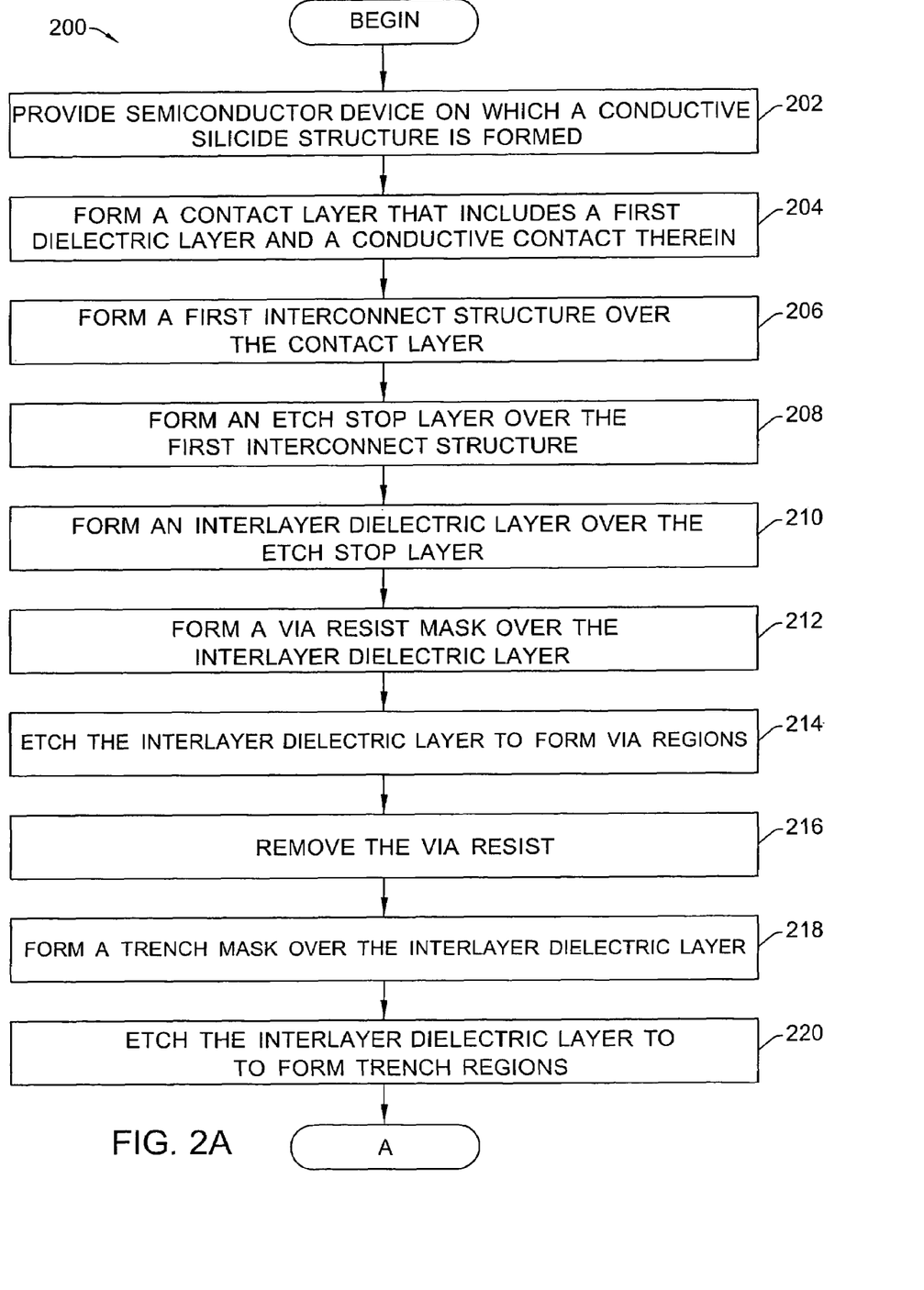
FIGS. 2A and 2B are a flow diagram illustrating a method of fabricating a semiconductor device in accordance with an aspect of the present invention.
Figure 2B:
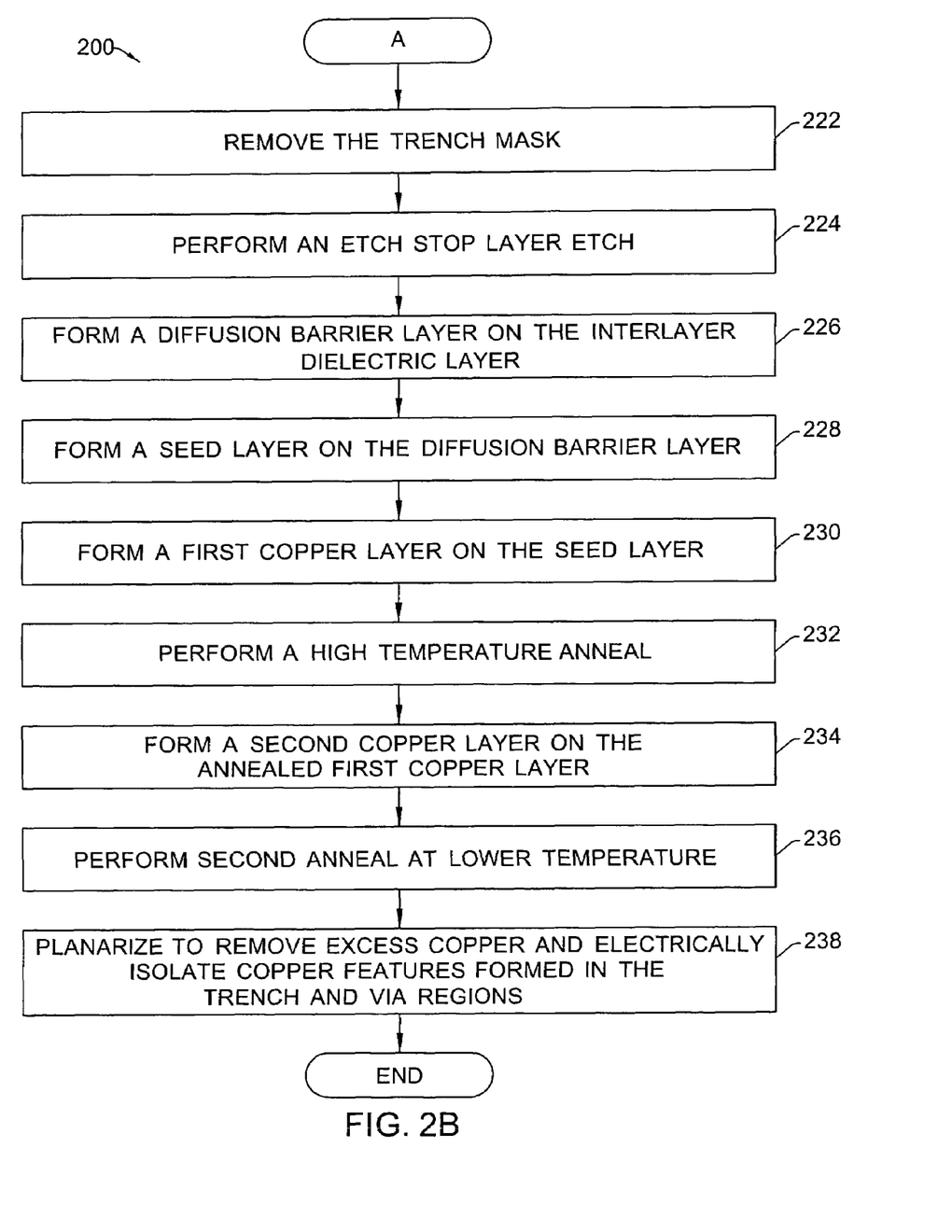

FIGS. 2A and 2B are a flow diagram illustrating a method 200 of fabricating a semiconductor device in accordance with an aspect of the present invention. The method 200 employs two sequences of depositing copper material and annealing to mitigate formation of void regions, such as shown in FIG. 1H.

The method 200 begins at block 202 wherein a semiconductor device comprising a substrate or body in which a feature such as a conductive silicide structure is formed. A contact layer is formed over the substrate including a first dielectric layer and a conductive contact at block 204. A first interconnect structure, including a second dielectric layer in which a second conductive contact is formed, is formed over the contact layer to provide electric coupling to the first contact at block 206. An etch stop layer is formed over the second dielectric layer and over the second contact/conductive feature at block 208. An interlayer dielectric layer is formed over the etch stop layer at block 210. Typically, a bottom antireflective coating (BARC) layer is formed over the interlayer dielectric layer and a resist mask is formed over the BARC layer at block 212.

Via regions are formed by etching the interlayer dielectric layer to form via cavities or regions in the interlayer dielectric layer at block 214. The via resist mask and BARC layer can then be removed by a suitable process, such as a resist ashing process and/or a wet clean, at block 216.

A second BARC layer and a trench resist mask are formed over the device at block 218. Trench regions are formed by etching the interlayer dielectric layer to form the trench regions or cavities at block 220. The second BARC layer and the trench resist mask may then be removed by a suitable process, such as a resist ashing process and/or a wet clean, at block 222. An etch stop etch is then performed at block 224 to remove a portion of the etch stop layer underneath the via regions.

A diffusion barrier layer is optionally formed (e.g., for a copper metallization process) on the interlayer dielectric layer at block 226 and on walls and bottom surfaces of the via and trench regions. The diffusion barrier layer is deposited by a suitable process such as physical vapor deposition, chemical vapor deposition, or atomic layer deposition. The material employed to form the diffusion barrier layer is selected to mitigate copper diffusion into the interlayer dielectric layer and adjacent regions. Such materials include, but are not limited to, tantalum, tantalum nitride, tantalum silicon nitride, titanium nitride, titanium silicon nitride, tungsten, tungsten nitride, tungsten silicon nitride, or contain ruthenium, iridium, or other binary or ternary compounds. In the case of physical vapor deposition for example, the deposition of the diffusion barrier layer is typically performed in an environment where the pressure is between about 0.5 and 50 mTorr, and a temperature between about 0 and 200 degrees Celsius to a thickness between about 10 and 500 angstroms. It is appreciated that the diffusion barrier can be omitted for some types of interlayer dielectric layers, particularly those that mitigate diffusion of copper themselves.

A seed layer is optionally formed on the diffusion barrier layer at block 228 by depositing a relatively thin layer of conductive material (e.g., copper). The seed layer provides nucleation sites for subsequent deposition of copper and/or copper containing material.

A first layer of copper is formed on the seed layer at block 230 using a suitable copper deposition process. Some examples of suitable deposition mechanisms include electrochemical deposition (ECD), electroless deposition (e-less dep), chemical vapor deposition (CVD), and physical vapor deposition (PVD).

ECD, which is also referred to as electroplating, is performed in an electroplating system sometimes referred to as an ECD plating bath. If this mechanism is employed, the seed layer of block 230 is formed on the device after the diffusion barrier layer is formed. Typically, the seed layer is deposited by CVD and/or PVD. The copper is then formed on the device, referred to as plating, by electrically coupling the device with a cathode/wafer holder in a reactor chamber or reservoir filled with electrolytic copper-containing fluid. A voltage is applied across the cathode/wafer holder and an anode via a power source to establish an electric field in the electrolytic fluid, causing migration and deposition of copper to the semiconductor device, particularly the seed layer, wherein the device operates as a cathode during the plating operation. The rate of copper deposition/plating is generally proportional to the current between the anode and cathode.

The first layer of copper is typically formed without an overburden fill. As a result, the first layer of copper is insufficient for forming copper interconnects and vias in all of the trench and via regions. In one variation of the method, the first layer is formed so as to substantially fill the via regions without substantially filling the trench regions. Preferably, the first metal deposition at 230 comprises substantially filling the smallest via/trench features in that metallization layer. Consequently, no overburden, or almost no overburden exists in any of the via/trench features. A high temperature anneal process (e.g., about 200 to 450 degrees Celsius) is then performed at block 232 to complete copper grain growth for the deposited metal.

The inventors of the present invention appreciate that a higher temperature anneal is possible compared with conventional copper damascene processes due to the fact that relatively less copper is deposited at this point. As a result, greater copper grain growth can be obtained for the first layer of copper while mitigating creation of void regions. For example, conventionally a single anneal is about 150–250 C. for about 30 minutes. According to the present invention, an elevated temperature anneal may be performed at a temperature of about 250–450 C. for about 20–120 minutes. Because of the lack of overburden, improved grain growth is obtained while concurrently avoiding or substantially reducing stress induced voiding.

A second layer of copper is then formed on the annealed first layer of copper at block 234 to a desired thickness for sufficient overburden. That is, sufficient deposition occurs to ensure that the largest via/trench features in that metallization layer are completely filled, wherein such deposition will result in substantial overburden to smaller via/trench features. A suitable deposition/plating mechanism, such as described above, is employed. Subsequently, a second anneal is performed at block 236 at a lower temperature (e.g., about 100 to 350 degrees Celsius) to grow the copper grains of the second layer of copper and to promote further growth of the grains of the first layer of copper.

A planarization process is performed at block 238 to remove excess metal and electrically isolate copper features formed in the trench and via regions. Additional metallization layers and/or packaging can subsequently be performed to complete fabrication of the semiconductor device.

FIGS. 3A to 3I depict fabrication of a semiconductor device 302 with copper lines in accordance with an aspect of the present invention. The device 302 is fabricated via the method 200 of FIGS. 2A and 2B. The FIGS. 3A to 3H are exemplary in nature and are provided to further illustrate the method 200 and the present invention. It is appreciated that variations in structure, composition, dimensions, and the like for the device 302 can occur and still be in accordance with the present invention.

Figure 3A:
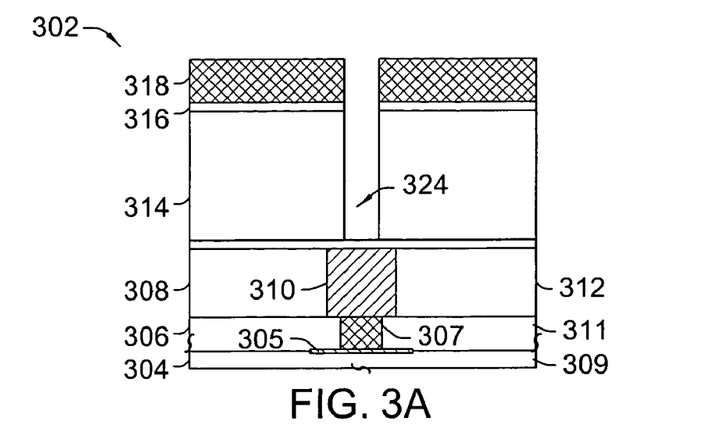
FIGS. 3A to 3I depict fabrication of a semiconductor device with copper lines in accordance with an aspect of the present invention.

FIG. 3A depicts the semiconductor device 302 comprising a semiconductor substrate or body 304. A feature such as a conductive silicide structure 305 is formed therein. A contact layer 306 is formed over the substrate 304 and comprises a first dielectric layer 309 in which a first conductive contact 307 is formed. A first interconnect structure or layer 308 is formed on the contact layer 306 and comprises a second dielectric layer 311 in which a second conductive contact 310 is formed. The first interconnect structure 308 provides electric coupling to the first contact 307. An etch stop layer 312 is formed on the first interconnect structure 308 to serve as an etch stop layer for subsequent etch operations.

An interlayer dielectric layer 314 is formed on the etch stop layer 312. A first BARC layer 316 is shown formed on the interlayer dielectric layer 314. A via resist mask 318 is formed on the BARC layer 316, and a via region 324 is formed in the interlayer dielectric layer 314 via a suitable etch process, as described above. The etch stop layer 312 serves as an etch stop for the etch process.

Figure 3B:
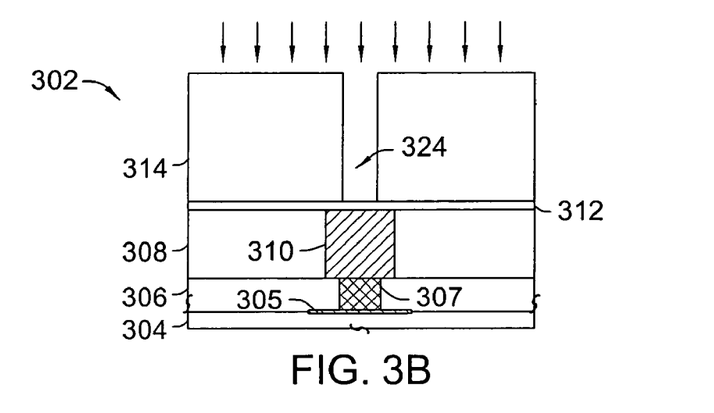

After formation of the via region 324, the BARC layer 316 and the via resist mask 318 are removed by a suitable wash/cleaning operation. FIG. 3B depicts the device 302 after removal of the BARC layer 316 and the via resist mask 318.

Figure 3C:
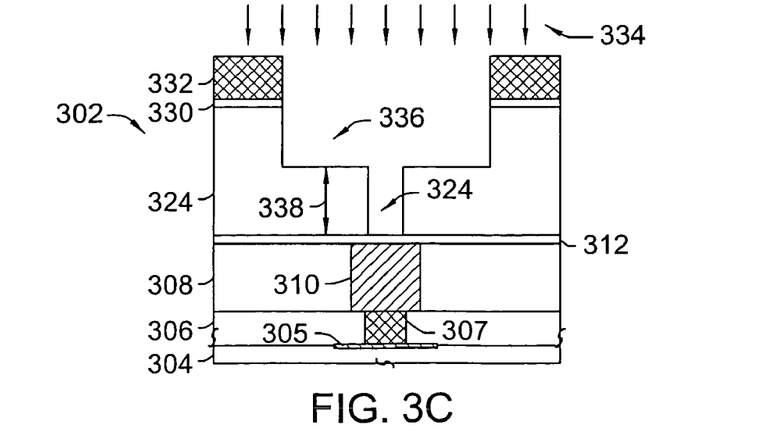
Figure 3D:
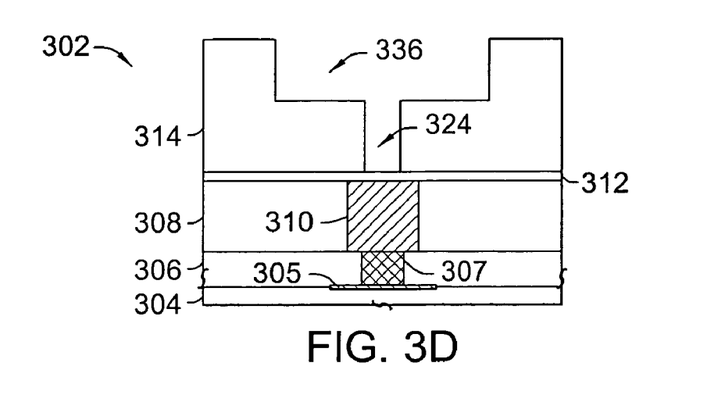
Figure 3E:
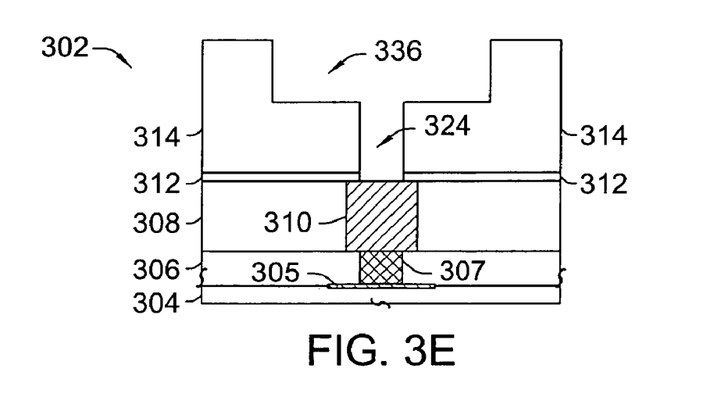

A second BARC layer 330 is then formed on the interlayer dielectric layer 314 and a trench resist mask 332 is formed on the second BARC layer 330. The second BARC layer 330 and the trench resist mask 332 are employed in a suitable etch operation 334 to form a trench region 336 as shown in FIG. 3C. A bottom of the trench region 336 is located a distance 338 from the etch stop layer 312. The second BARC layer 330 and the trench resist mask 332 are then removed by a suitable wash/clean operation as depicted in FIG. 3D. Continuing, a portion of the etch stop layer 312 is removed below the via region 324 via an etch process to permit electrical conductance to the second conductive contact 310 as shown in FIG. 3E.

Figure 3F:
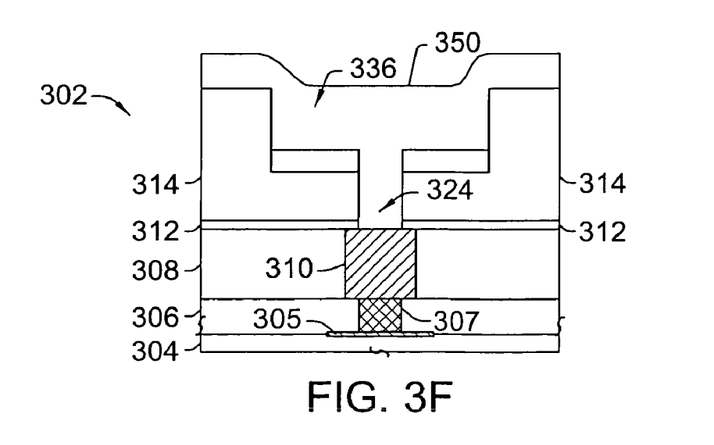

FIG. 3F illustrates formation of a first layer of copper 350 in the via region 324 and most of a portion of the trench region 336. The first layer of copper 350 is formed, in one example, by depositing a diffusion barrier layer (not shown) and forming a seed layer (not shown) thereon. Copper material is then plated/deposited on the seed layer by a suitable process, such as shown and described above, to form the first layer of copper 350.

The first layer of copper 350 is typically formed without a substantial amount of overburden fill and, as a result, typically fills only a portion of the trench region 336. As a consequence, the first layer of copper is insufficient for forming copper interconnects, lines and vias in both the trench and via regions. That is, the smallest via/trench features associated with that metallization layer will be almost completely filled and consequently will have no or little overburden associated therewith, as illustrated in FIG. 3F. However, for any larger via/trench features also concurrently being filled, since they exhibit a larger feature volume, they will be only partially filled and thus also exhibit no overburden.

The first layer of copper 350 is then annealed via a high temperature anneal process in order to promote grain growth. As stated previously, the inventors of the present invention appreciate that a higher temperature anneal is possible compared with conventional copper damascene fill processes due to the fact that relatively less copper is deposited at this point. As a result, greater copper grain growth can be obtained for the first layer of copper than conventional copper filling processes while mitigating creation of void regions.

Figure 3G:
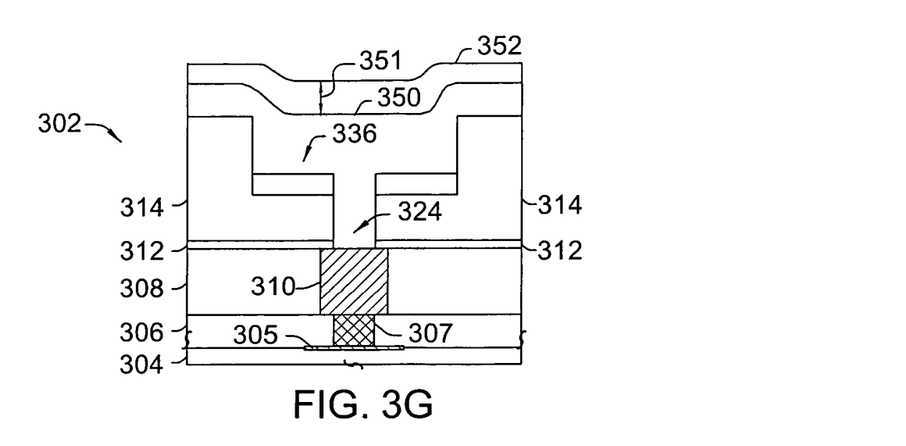
Figure 3H:
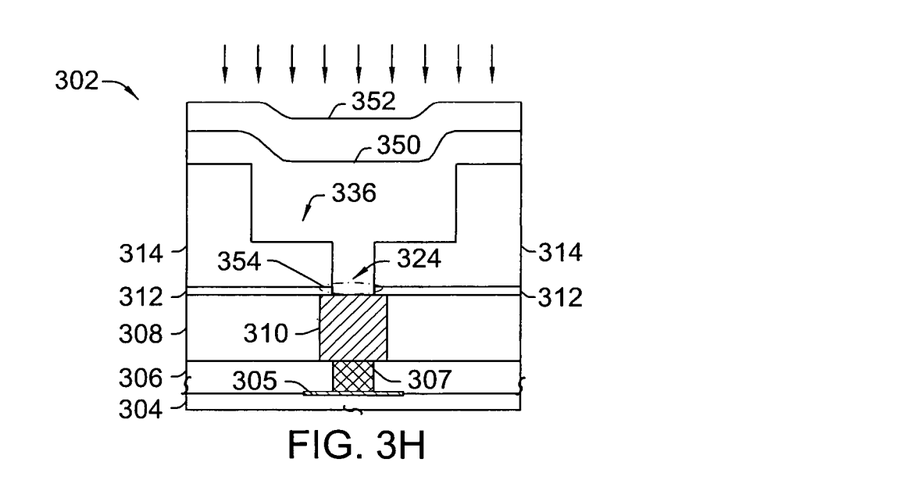

FIG. 3G shows that a second layer of copper 352 is formed on the annealed first layer of copper 350 to a desired thickness for sufficient overburden 351. Therefore enough metal is deposited to completely fill the largest via/trench features in the present metallization layer. A suitable deposition/plating mechanism, such as described above, is employed. Subsequently, the second layer and the first layer of copper (350 and 352) are annealed at a lower temperature (e.g., about 100 to 350 degrees Celsius) to grow the copper grains of the second layer of copper 352 and to promote further growth of the grains of the first layer of copper 350. FIG. 3H illustrates the device 302 after the second, lower temperature anneal and it can be seen that formation of void regions 352 has been mitigated.

Figure 3I:
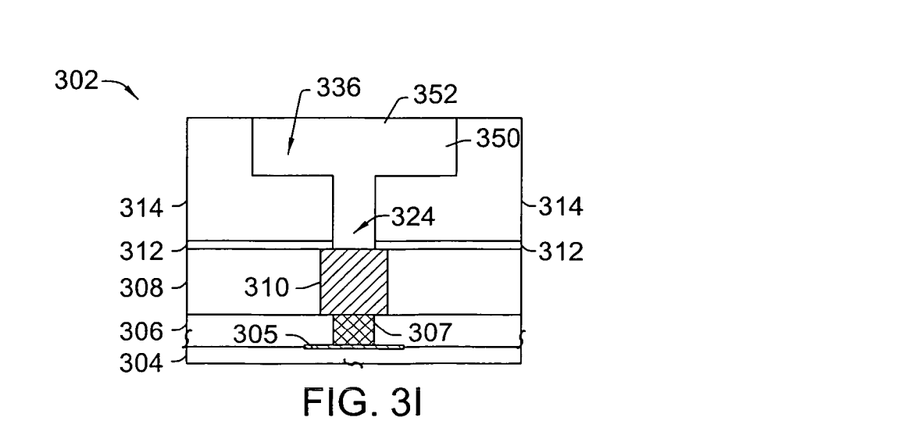

A planarization process, typically CMP, is performed to remove excess metal and electrically isolate copper features/lines formed in the trench and via regions as shown in FIG. 3I. Additional metallization layers and/or packaging can subsequently be performed to complete fabrication of the semiconductor device.

Figure 4:
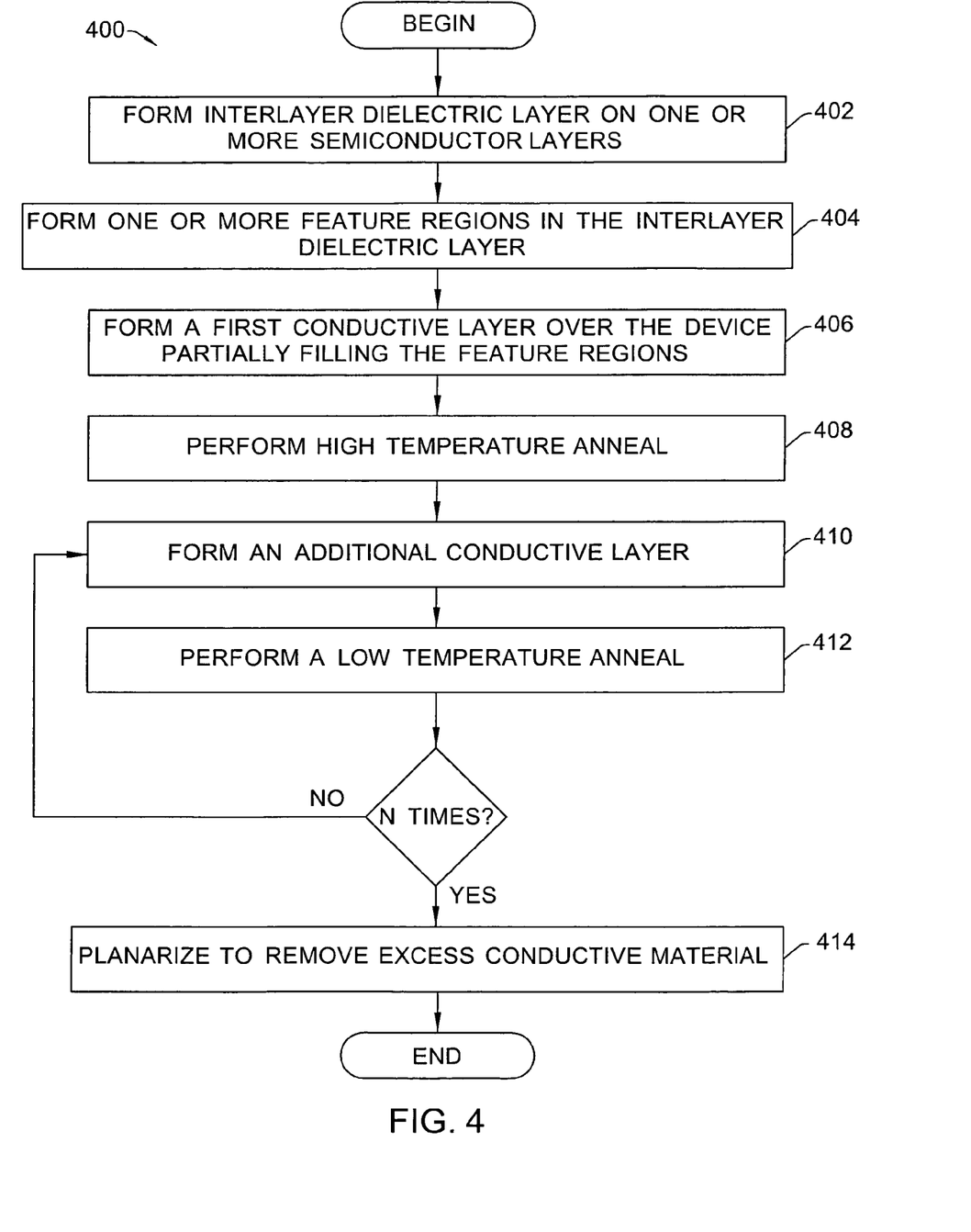
FIG. 4 is a flow diagram illustrating a method of fabricating a semiconductor device in accordance with an aspect of the present invention.

While, for purposes of simplicity of explanation, the methodologies of FIGS. 2A, 2B, and 4 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 4 is a flow diagram illustrating a method 400 of fabricating a semiconductor device in accordance with an aspect of the present invention. The method 400 employs repeatable sequences of depositing conductive material and annealing to mitigate formation of void regions and increase grain size of the deposited conductive material.

The method 400 begins at block 402 wherein an interlayer dielectric layer is formed on one or more semiconductor layers. The interlayer dielectric layer is formed typically by depositing a suitable dielectric material including, but not limited to, silicon dioxide, silicon nitride, and silicon oxynitride. The one or more semiconductor layers can comprise one or more of the following: metallization layers, contact layers, other interlayer dielectric layers, and the like.

One or more feature regions are formed in the interlayer dielectric layer at block 404. The feature regions include trench regions, via regions, and the like. The feature regions are formed by one or more masks and corresponding patterning operations.

A first conductive layer is formed over the device partially or substantially completely filling the one or more feature regions at block 406 such that the smallest via/trench regions have little or no overburden associated therewith. The first conductive layer is formed via a suitable plating deposition process. An example of a suitable process includes forming a barrier layer that mitigates diffusion of later deposited conductive materials into the interlayer dielectric layer, forming a seed layer of a conductive seed material, and then plating or depositing a conductive material via ECD, e-less dep, CVD, and PVD. The conductive seed material can vary from the conductive material deposited to substantially comprise the first conductive layer. Some examples of suitable conductive materials include, for example, copper, copper alloys, aluminum, aluminum alloys, and the like.

A high temperature anneal is performed at block 408 that promotes grain growth in the first conductive layer. The first conductive layer is not formed with an amount of overburden or overburden fill. As a result, the anneal yields less stress in the first conductive layer than conventional metallization solutions, particularly within the feature regions. Accordingly, higher temperatures and/or longer periods of time can be employed to achieve greater grain growth in the first conductive layer than would be possible for a conventional conductive layer deposited to completely fill the feature regions with an overburden fill.

An additional conductive layer is formed on the first annealed conductive layer at block 410. As with the first conductive layer, the additional conductive layer is formed via a suitable plating/deposition process. Subsequently, a low temperature anneal is performed at block 412 to promote grain size growth in the additional conductive layer and previously formed conductive layers. The low temperature anneal is performed at a lower temperature than the high temperature anneal performed at block 408. As a result, the low temperature anneal mitigates formation of void regions, particularly in feature regions of the first conductive layer.

Block 410 and 412 can be repeated one or more times (N) in order to obtain a sufficient overburden fill of the feature regions. Subsequently, a planarization operation is performed at block 414 to remove excess conductive material from the device and electrically isolate feature regions filled with the conductive material.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device, comprising:
   forming a first opening in a dielectric layer;
   depositing a first conductive material, completely filling the first opening with the first conductive material, wherein the filled first opening comprises substantially no overburden;
   performing a first anneal after depositing the first conductive material;
   depositing a second conductive material after performing the first anneal, thereby generating an overburden with respect to the first opening; and
   performing a second anneal after depositing the second conductive material.

2. The method of claim 1, further comprising planarizing the device to remove excess portions of the first and second conductive materials from an upper surface of the dielectric layer.

3. The method of claim 1, wherein the first and second conductive materials comprise one of copper, silver, aluminum and alloys thereof.

4. The method of claim 1, wherein the first anneal is performed at a first temperature and the second anneal is performed at a second temperature, and wherein the first temperature is greater than a second temperature.

5. The method of claim 1, wherein the first opening comprises a via portion having a first cross sectional area associated therewith, and a trench portion overlying the via portion and having a second cross sectional area associated therewith, wherein the second cross sectional area is greater than the first cross sectional area, thereby defining a dual damascene type opening.

6. The method of claim 1, wherein the first and second conductive materials comprise copper, and wherein performing the first anneal comprises exposing the device to a temperature of about 450 C.

7. The method of claim 6, wherein the first anneal is performed for a duration of about 30 minutes.

8. A method of fabricating a semiconductor device comprising:
   forming an interlayer dielectric layer on one or more semiconductor layers;
   forming a via region in the interlayer dielectric layer;
   forming a trench region overlying the via region in the interlayer dielectric layer, thereby defining a first dual damascene type opening in the interlayer dielectric;
   forming a first conductive layer in the first dual damascene opening that fills the first dual damascene opening without an overburden;
   performing a first anneal to increase a grain size of the first conductive layer;
   forming a second conductive layer over the first conductive layer, wherein the second conductive layer comprises an overburden amount;
   performing a second anneal to a increase grain size of the first and second conductive layers; and
   planarizing the device to remove excess portions of the first and second conductive layers from an upper surface of the interlayer dielectric layer.

9. The method of claim 8, wherein the first conductive layers comprise one of copper, silver, aluminum or alloys thereof.

10. The method of claim 8, wherein the first and second conductive layers comprise the same conductive material.

11. The method of claim 8, wherein the first and second conductive layers comprise copper, and wherein forming the first copper layer comprises depositing a barrier layer to mitigate copper diffusion, depositing a seed layer on the barrier layer, and depositing copper material via electrochemical deposition.

12. The method of claim 8, wherein the first anneal is performed at a higher temperature than the second anneal.

13. A method of fabricating a semiconductor device comprising:

forming an interlayer dielectric layer on one or more semiconductor layers;

forming a via region in the interlayer dielectric layer;

forming a trench region over the via region in the interlayer dielectric layer, thereby defining a dual damascene opening therein;

forming a first conductive layer over the device on upper surfaces of the interlayer dielectric layer and on side and bottom portions of the via region and the trench region, the first conductive layer not sufficient to create an overburden with the respect to the dual damascene opening;

performing a first anneal to promote grain size growth of the first conductive layer;

forming an additional conductive layer over the device;

performing an additional anneal to promote grain size growth of the first conductive layer and the additional conductive layer; and planarizing the device to remove portions of the first and second conductive layers from upper surfaces of the interlayer dielectric layer and planarize an upper surface of the device.

14. The method of claim 13, further comprising repeatedly forming the additional conductive layer and performing an additional anneal until an overburden amount of conductive material is deposited that substantially fills the dual damascene opening.

15. The method of claim 13, wherein the first conductive layer is comprised of copper.

16. The method of claim 13, wherein the first conductive layer is comprised of a copper alloy.

17. The method of claim 13, wherein forming the first conductive layer comprises plating a conductive material via an electroless deposition process, plating a conductive material via electrochemical deposition, or depositing a conductive material via a physical vapor deposition process.

* * * * *